United States Patent
Jeong

(10) Patent No.: US 7,670,906 B2
(45) Date of Patent: Mar. 2, 2010

(54) FLASH MEMORY DEVICE

(75) Inventor: Tae-Woong Jeong, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 60 days.

(21) Appl. No.: 11/963,588

(22) Filed: Dec. 21, 2007

(65) Prior Publication Data

US 2008/0157167 A1    Jul. 3, 2008

(30) Foreign Application Priority Data

Dec. 29, 2006    (KR) .................. 10-2006-0137320

(51) Int. Cl.
*H01L 21/336* (2006.01)

(52) U.S. Cl. .............. 438/257; 438/211; 438/593; 257/E21.422; 257/E21.68

(58) Field of Classification Search ............... 438/201, 438/211, 257, 260, 593; 257/E21.179, E21.422, 257/E21.68
See application file for complete search history.

(56) References Cited

U.S. PATENT DOCUMENTS

2003/0001197 A1    1/2003    Chang et al.
2008/0054334 A1*    3/2008    Jang .......................... 257/315

* cited by examiner

*Primary Examiner*—Thanhha Pham
(74) *Attorney, Agent, or Firm*—Sherr & Vaughn, PLLC

(57) ABSTRACT

Embodiments relate to a flash memory device and to method of fabricating a flash memory device is disclosed. According to embodiments, a method may include forming a device isolation layer on a semiconductor substrate to define active regions, forming floating gate patterns on the active regions, forming the photoresist patterns on the device isolation layer such that the photoresist patterns have side walls higher than the floating gate patterns, forming spacer patterns at the side walls of the photoresist patterns such that the spacer patterns partially cover the floating gate patterns, and etching the floating gate patterns by a predetermined depth using the spacer patterns as an etching mask.

8 Claims, 3 Drawing Sheets

FLASH MEMORY DEVICE

The present application claims priority under 35 U.S.C. 119 and 35 U.S.C. 365 to Korean Patent Application No. 10-2006-0137320 (filed on Dec. 29, 2006), which is hereby incorporated by reference in its entirety.

BACKGROUND

A flash memory device may be a device that electrically writes and erases data. The flash memory device may be a device that stores electric charges in floating gates or discharges the electric charges stored in the floating gates to a substrate, using tunneling of the electric charges through a tunnel insulation layer.

The tunneling, which may an important operation of the flash memory device, depends upon how much voltage applied to a control gate electrode may be transmitted to the tunnel insulation layer to create an electric field. The ratio of the voltage applied to the tunnel insulation layer to the voltage applied to the control gate electrode may be represented by a coupling ratio. The coupling ratio may be increased when the capacitance between the floating gates and the control gate may be greater than the capacitance between the substrate and the floating gates.

A silicon oxide-silicon nitride-silicon oxide (ONO) layer having a high dielectric constant may be used as an intergate dielectric layer to increase the capacitance between the floating gates and the control gate. As semiconductor devices have become more highly integrated, intergate dielectric layers having a higher dielectric constant have become more desirable. If the dielectric constant is too high, however, leakage current characteristics may be deteriorated, and may cause retention characteristics to be reduced.

A method of increasing opposite areas of the floating gates and the control gate also has been proposed to increase the capacitance between the floating gates and the control gate. If a concavo-convex structure is formed on the top of the floating gates, it may be possible to increase the area of the intergate dielectric layer formed on the floating gates.

FIGS. 1 and 2 are drawings illustrating a related art method of fabricating a flash memory device.

Referring to FIG. 1, device isolation layer 12 may be formed on semiconductor substrate 10 and may define active regions 14, and floating gate layer 18 may be formed on active region 14 via tunnel insulation layer 16. Photoresist patterns 20 may be formed on floating gate layer 18. Photoresist patterns 20 may be formed by exposing the photoresist film using reticle 22 having mask patterns 24 formed thereon. At this time, it may be possible to reduce the intensity of light transmitted through regions between mask patterns 24, by adjusting a width of mask patterns and the distance between the mask patterns. As a result, the exposure degree of the photoresist film may be changed, and therefore, photoresist patterns 20 may be formed on floating gate layer 18 in a concavo-convex structure.

Referring to FIG. 2, photoresist patterns 20 and floating gate layer 18 may be anisotropically etched. Since photoresist patterns 20 may have a concavo-convex structure, the concavo-convex structure of photoresist patterns 20 may be transferred to floating gate layer 18, thereby forming floating gate patterns 18a having a concavo-convex structure.

In the related art, the height difference between the concave parts and the convex parts of floating gate patterns 18a and the width of the opposite concave parts of floating gate patterns 18a may depend upon the shape of photoresist patterns 20. As described above, photoresist patterns 20 may have the concavo-convex structure due to the intensity difference of the exposure according to the width of the mask patterns formed on reticle 22 and the distance between the mask patterns formed on reticle 22. The arrangement of mask patterns 24 may be chosen to obtain a desired shape of mask patterns 24.

Consequently, an adjustment of the size of floating gate patterns 18a, the height difference between the concave parts and the convex parts of floating gate patterns 18a and a width of the concave and convex parts of floating gate patterns 18a may be limited.

Also, a complicated reticle manufacturing process may be required to obtain desired floating gate patterns 18a, which may result in an inability to rapidly change the structure of the device. In addition, the characteristics of photoresist film supplied to a production line may be variable, with the result that the shape of photoresist patterns 20 may be different from what may be desired.

SUMMARY

Embodiments relate to a semiconductor memory device and to a method of fabricating a flash memory device.

Embodiments relate to a flash memory device and a method of fabricating a flash memory device that may be capable of easily controlling a concavo-convex structure of floating gate patterns when forming the concavo-convex structure of the floating gate pattern.

Embodiments relate to a flash memory device and a method of fabricating a flash memory device in which the deviation of the shape of the floating gate patterns is small.

According to embodiments, a method of fabricating a flash memory device may include a process for forming floating gates having a concavo-convex structure formed at the top thereof.

According to embodiments, the method may include forming a device isolation layer on a semiconductor substrate to define active regions, forming floating gate patterns on the active regions, forming the photoresist patterns on the device isolation layer such that the photoresist patterns have side walls higher than the floating gate patterns, forming spacer patterns at the side walls of the photoresist patterns such that the spacer patterns partially cover the floating gate patterns, and etching the floating gate patterns by a predetermined depth using the spacer patterns as an etching mask.

According to embodiments, the floating gate patterns may be etched using the spacer patterns as an etching mask, and therefore, the floating gate patterns may be formed such that the floating gate patterns have a concavo-convex structure in which the width of concave parts is uniform.

DRAWINGS

DESCRIPTION

Figure 1:
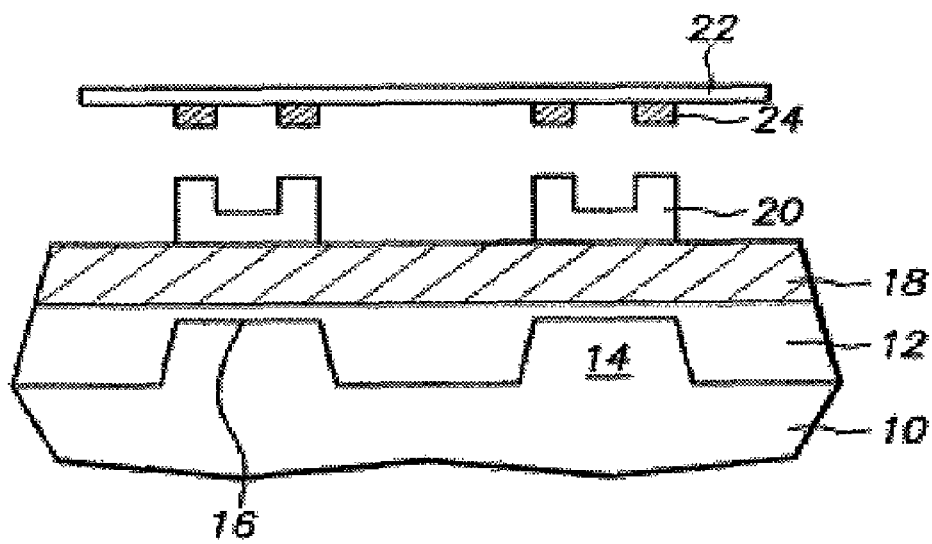
FIGS. 1 and 2 are process drawings, in section, illustrating a related art method of fabricating a flash memory device.
Figure 2:
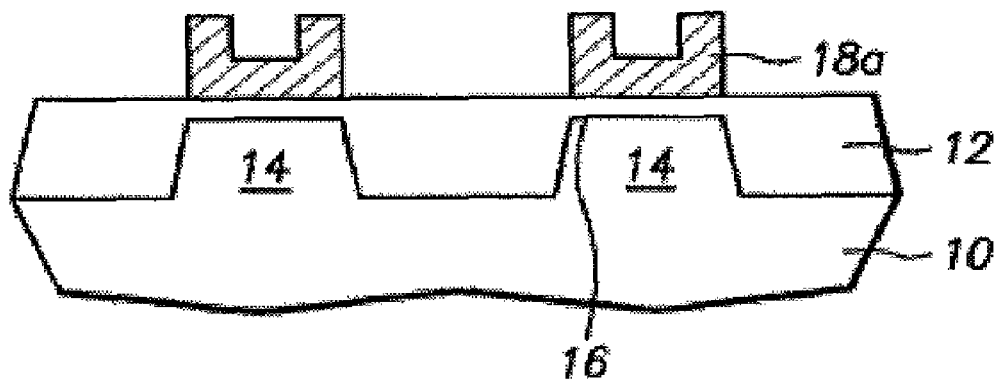
Figure 3:
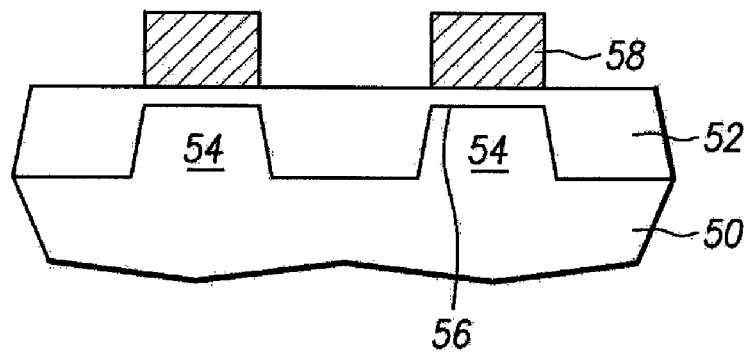
FIGS. 3 to 6 are process drawings, in section, illustrating a method of fabricating a flash memory device according to embodiments.

Referring to FIG. 3, device isolation layer 52 may be formed on a semiconductor substrate 50 and may define active regions 54. Active regions 54 may be arranged on semiconductor substrate 50 in parallel with each other. Consequently, device isolation layer 52 may be disposed at opposite sides of respective active regions 54.

Tunnel insulation layer 56 may be formed on active regions 54. Tunnel insulation layer 56 may be made of thermal oxide. Tunnel insulation layer 56 may be formed only on active regions 54. A floating gate layer may be formed on the overall surface of semiconductor substrate 50 at which tunnel insulation layer 56 may be formed. The floating gate layer may be patterned to form floating gate patterns 58 on active regions 54.

Floating gate patterns 58 may be arranged on semiconductor substrate 50 in parallel with active regions 54. Device isolation layer 52 may be exposed between floating gate patterns 58.

Figure 4:
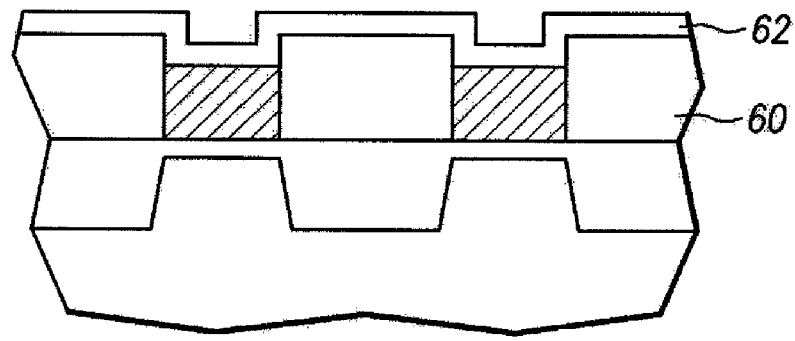

Referring to FIG. 4, photoresist patterns 60 may be formed on device isolation layer 52 exposed between floating gate patterns 58. Photoresist patterns 60 may be formed by forming photoresist film on the overall surface of the substrate at which floating gate patterns 58 may be formed and exposing the photoresist film. According to embodiments, if a negative photoresist film is formed and the photoresist film is exposed using a photo mask for forming the floating gate patterns, the photoresist film may be exposed on regions where floating gate patterns 58 may be not formed, i.e., on device isolation layer 52 exposed between floating gate patterns 58. According to embodiments, the photoresist film on the remaining regions, excluding the exposed photoresist film, may be developed to form photoresist patterns 60.

The photoresist film may be formed such that the thickness of the photoresist film may be greater than that of floating gate patterns 58, and may form photoresist patterns 60 such that photoresist patterns 60 have side walls that may be higher than floating gate patterns 58.

Spacer insulation layer 62 may be conformally formed on the overall surface of the substrate at which photoresist patterns 60 may be formed. Spacer insulation layer 62 may be formed along the top of floating gate patterns 58 and the side walls of photoresist patterns 60 higher than floating gate patterns 58.

Figure 5:
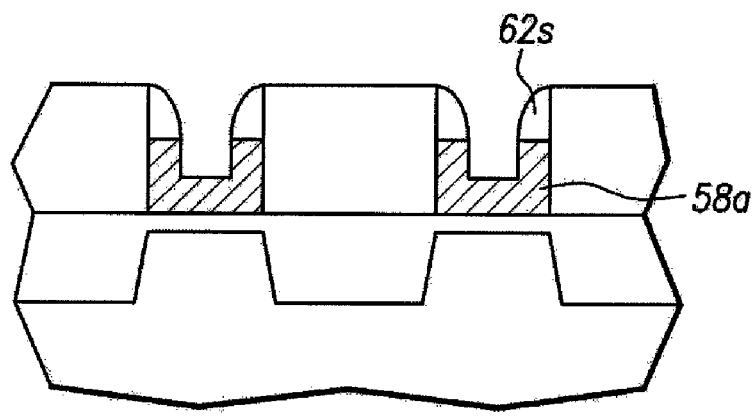

Referring to FIG. 5, spacer insulation layer 62 may be anisotropically etched to form spacer patterns 62s. Spacer patterns 62s may be formed at the side walls of photoresist patterns 60 at opposite sides of floating gate patterns 58 so as to cover opposite side edges of floating gate patterns 58.

Floating gate patterns 58 may be partially exposed between the opposite spacer patterns 62s. A width of spacer patterns 62s may be decided by adjusting the thickness and the anisotropic etching condition of spacer insulation layer 62. According to embodiments, opposite spacer patterns 62s may have the same width and thickness.

According to embodiments, the exposed parts of floating gate patterns 58 may be partially etched using spacer patterns 62s at the opposite side edges of floating gate patterns 58 as an etching mask. According to embodiments, a concavo-convex structure may be formed at the top of floating gate patterns 58. Since spacer patterns 62s may have the same width and thickness, the concavo-convex structure of floating gate patterns 58a may be stably and uniformly formed.

Figure 6:
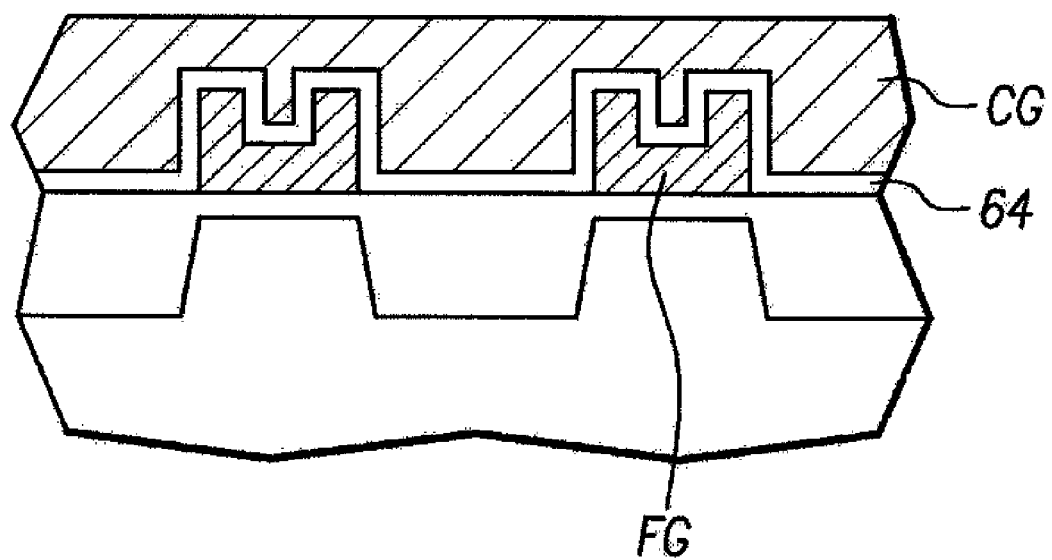

Referring to FIG. 6, spacer patterns 62s and photoresist patterns 60 may be removed to expose the side walls of floating gate patterns 58a having the concavo-convex structure. Intergate dielectric layer 64 may be formed on the overall surface of the substrate, and a control gate conductive layer may be formed on intergate dielectric layer 64. Intergate dielectric layer 64 may be conformally formed on floating gate patterns 58a having the concavo-convex structure. The control gate conductive layer may be formed such that gaps defined between floating gate patterns 58a may be filled with the control gate conductive layer.

According to embodiments, the control gate conductive layer, intergate dielectric layer 64, and floating gate patterns 58a may be successively etched to form control gate electrode CG, traversing the top of active regions 54, and floating gates FG, disposed between control gate electrode CG and active regions 54. Intergate dielectric layer 64 may be disposed between floating gates FG and control gate electrode CG. Tunnel insulation layer 56 may be disposed between floating gates FG and active regions 54.

According to embodiments, the concavo-convex structure of the floating gates may be formed using the spacer patterns formed at the opposite side edges at the top of the floating gates as an etching mask. According to embodiments, the width of the spacer patterns may be uniform, and therefore, the width of the concave parts of the floating gates may be also uniform, whereby it may be possible to obtain a flash memory device having a small deviation of a coupling ratio.

Embodiments may have the effect of forming a concavo-convex structure having a stable shape and little deformation at the top of floating gates. This may reduce the dispersion of the characteristics of a device. Embodiments may have the effect of forming photoresist patterns, by which the side walls of a spacer patterns may be supported, using a photo mask for forming floating gate patterns. This may reduce time and effort needed to manufacture an additional reticle.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method, comprising:
    forming a device isolation layer over a semiconductor substrate to define active regions;
    forming floating gate patterns over active regions of the semiconductor substrate;
    forming photoresist patterns over the device isolation layer and between the floating gate patterns such that the photoresist patterns have side walls higher than side walls of the floating gate patterns;
    forming spacer patterns at the side walls of the photoresist patterns such that the spacer patterns partially cover the floating gate patterns; and
    etching the floating gate patterns by a predetermined depth using the spacer patterns as an etching mask.

2. The method of claim 1, wherein the floating gate patterns are etched such that the floating gate patterns have a concavo-convex structure.

3. The method of claim 1, wherein forming the photoresist patterns comprises:
    forming a negative photoresist film;
    exposing the photoresist film using a photo mask for forming the floating gate pattern; and
    developing the exposed photoresist film.

4. The method of claim 3, wherein a thickness of the photoresist film is greater than that of the floating gate patterns.

5. The method of claim 1, wherein the photoresist patterns are formed over the device isolation layer at opposite sides of the floating gate patterns, and the spacer patterns cover opposite side edges of the floating gate patterns.

6. The method of claim 5, wherein forming the spacer patterns comprises:

forming a conformal spacer insulation layer over a surface of the substrate at which the photoresist patterns are formed; and anisotropically etching the spacer patterns to partially expose the floating gate patterns.

7. The method of claim 6, wherein a width of the partially exposed floating gate patterns is determined by adjusting a thickness and the anisotropic etching condition of the spacer patterns.

8. The method of claim 1, further comprising:

removing the spacer patterns and the photoresist patterns to form floating gate patterns having a concavo-convex structure formed at the top thereof; and forming a conformal intergate dielectric layer and control gate conductive layer over the floating gate patterns having the concavo-convex structure.

\* \* \* \* \*